US006307498B1

(12) United States Patent
Eglit

(10) Patent No.: US 6,307,498 B1
(45) Date of Patent: *Oct. 23, 2001

(54) DIGITAL DISPLAY UNIT OF A COMPUTER SYSTEM HAVING AN IMPROVED METHOD AND APPARATUS FOR SAMPLING ANALOG DISPLAY SIGNALS

(75) Inventor: Alexander Julian Eglit, Half Moon Bay, CA (US)

(73) Assignee: Genesis Microchip Corp., Alviso, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/655,195

(22) Filed: Sep. 5, 2000

Related U.S. Application Data

(63) Continuation of application No. 09/100,503, filed on Jun. 2, 1998.

(51) Int. Cl.[7] .................................................. H03M 1/12

(52) U.S. Cl. .................................................. 341/155

(58) Field of Search .................................. 341/155, 156, 341/122, 123, 124; 345/99, 213

(56) References Cited

U.S. PATENT DOCUMENTS 6,147,668 * 11/2000 Eglit .................................. 345/99

* cited by examiner

*Primary Examiner*—Brian Young
(74) *Attorney, Agent, or Firm*—Staas & Halsey LLP

(57) ABSTRACT

A digital display unit for minimizing the display artifacts which may be caused by aliasing of high frequency distortions present in wide bandwidth analog display signals. The minimization is achieved by modulating a sampling clock signal by different phase delay amounts for successive lines or frame. Due to such modulation, the analog display signal is sampled at different sampling points in different frames for the same pixel position. As digital display screens are typically designed to respond slowly to differing scanning intensities and as the human eye generally averages different color intensities at the same point, a low-pass filter effect may be in place with respect to the samples taken at the same pixel position. Display artifacts are minimized due to the sampling at different sampling points and the low-pass filter effect.

19 Claims, 8 Drawing Sheets

DIGITAL DISPLAY UNIT OF A COMPUTER SYSTEM HAVING AN IMPROVED METHOD AND APPARATUS FOR SAMPLING ANALOG DISPLAY SIGNALS

RELATED APPLICATION

The present application is related to the co-pending U.S. Patent Application entitled "A Method and Apparatus for Clock Recovery in a Digital Display Unit", Ser. No. 08/803, 824, Filed Feb. 24, 1997, and is incorporated in its entirety into the present application herewith.

This application is a continuation of Ser. No. 09/100,503 filed Jun. 2, 1998

BACKGROUND OF THE INVENTION

1. Field of the Invention

The present invention relates to computer graphics systems, and more specifically to a method and apparatus for sampling an analog display signal received in a digital display unit.

2. Related Art

Digital display units (e.g., flat panel monitors) are often used to display images encoded in an analog display signal. An analog display signal generally includes display data signal (e.g., in RGB format) and corresponding synchronization signals (e.g., HSYNC and VSYNC). The display data signal identifies a color intensity for each point of an image and the synchronization signals provide a time reference such that each portion of the display data signal can be correlated with a corresponding portion of the image.

Display signals are typically generated by a digital-to-analog converter (DAC) in a graphics source generally located outside of a digital display unit. The DAC generates a portion of a display data signal by processing each of several pixel data element values representing an image. Each pixel data element value generally represents the color intensity of a point of the image such that the display data signal represents the overall image. An analog-to-digital converter (ADC) located in a digital display unit usually samples display signals to recover the pixel data elements and display the represented images.

The analog display signals received by a digital display unit are characterized by frequency components. In general, signals which can change amplitude levels quickly (or sharply) include high bandwidth components, and are accordingly termed as wide bandwidth signals. On the other hand, signals which can only change slowly as a function of time may be termed as narrow-band signals.

In general, it is desirable that analog display signals be wide bandwidth signals as display signals may represent adjacent points differing substantially (e.g., no color intensity to complete brightness) in intensity level and an ideal display signals needs to transition in amplitude instantaneously to represent such adjacent points. Such an ideal signal (hereafter "stairway signal") resembles a "stairway" as is (illustrated below with reference to FIG. 1A) well-known in the relevant arts.

Unfortunately, the input to an ADC in a digital display unit may not resemble an ideal stairway-signal for several reasons. For example, DACs in typical graphics sources may not be able to generate stairway shaped signals due to practical limitations in cost and manufacturing technologies. As a result, overshoots of some magnitude are typical with transitions as illustrated with reference to FIG. 1A, which depicts a graph of a portion of display signal with amplitude on Y-Axis and time on X-Axis. The ideal stairway signal is shown as line 150.

Time duration 170 represents the pixel period, which is a time duration when the signal level represents the pixel data element value from which the portion is generated. Time duration 110 represents a rise time as the analog signal level changes to a desired amplitude level represented by stairway signal 150. Because of ADC imperfections, overshoot 120 is typically present in wide bandwidth analog display signals. The overshoot decreases substantially over time, and the overshoots are down to a large degree in the time duration 160. Therefore, time duration 160 ("sampling duration") is a suitable period for taking samples representing the corresponding pixel data element.

Unfortunately, overshoots (or other deviation from the ideal stairway signal) exist to some degree even in sampling duration 160, which may cause the sampled data element value to deviate from the corresponding pixel data element value. The deviation can be exacerbated with any other distortions introduced in a received analog display signal. For example, additional noise may be introduced in a cable carrying the display signal from a graphics source to a display unit. In addition, reflections may also be introduced due to impedance mis-match at various connections in the path of a display signal from a DAC to an ADC. Ringings of the ADC may introduce more distortions as is also well known in the relevant arts. Distortions may be problematic because the result may be an increase in the deviations from the correct value represented by stairway signal 150.

Due to the contribution of such distortions including the persistent overshoots, the sampled data element values can vary from the correct value represented by the ideal stairway signal 150. The effect is that perceptible display artifacts may be present in the displayed images. For example, the artifacts may have the form of rolling diagonal bars or horizontal lines or low frequency flicker.

The phenomenon causing the artifacts can also be appreciated based on the spectral analysis of typical wide bandwidth-band analog display signals. According to the Nyquist Theorem well known in the relevant arts, a signal having a bandwidth of B needs to be sampled at or greater than 2×B samples per second for accurate representation of the signals. Therefore, if a signal has a bandwidth of 50 Mega Hertz, the signal needs to be sampled at 100 Mega samples/second. However, as noted above, analog display signals are typically characterized by much higher bandwidth components. When sampled at a lower sampling rate (equaling a lower frequency at which the pixel data elements are encoded in the analog display signals), the sampled values include aliased components associated with the under sampled frequencies.

Display artifacts result due to such aliased components. These type of display artifacts may be undesirable in some situations.

To minimize the artifacts, one may employ one or more of a slower DAC, a low pass filter at the output of a fast DAC (before the analog signal is passed on to a cable connecting to a display unit), limited analog bandwidth ADC, and a low pass filter before the ADC in a digital display unit. An analog display signal presented to an ADC as a result of any such schemes is a signal which responds slowly to changes in the values of adjacent pixel data elements as generally illustrated with reference to FIG. 1B.

FIG. 1B illustrates a portion of an analog display signal (corresponding to a pixel data element) generated either as an output of a low pass filter or a slow DAC. Similar time durations are represented by similar numerals in comparison to FIG. 1A. The overshoots and external noise are substantially eliminated. However, due to the jitter generally present in sampling clocks driving ADCs and the short sampling period 160 particularly with the analog display signals generated at high dot clock speeds, the sampled data values may differ substantially from the corresponding pixel data element value corresponding to the display signal portion.

The result may be a decrease in the effective number of quantization levels in the operation of ADCs, and thus a reduction of effective number of bits (ENOB) as is well known in the relevant arts. As an illustration, assuming an ADC can generate an 8-bit output with the ability to discriminate between $2^8$ (256) color intensities (or quantization levels), only $2^5$ (ENOB=5) different values may be generated from an ADC because of the narrow bandwidth input signal to an ADC. Smaller ENOBs usually means a degradation in the display quality, and thus undesirable.

What is therefore needed is an effective method and apparatus which minimizes the display artifacts caused by noise components when displaying images encoded in wide-band analog display signals.

SUMMARY OF THE INVENTION

The present invention is directed to a method and apparatus for generating a sampling clock signal for sampling an analog display signal received by a digital display unit. The sampling clock is generated such that display artifacts caused by high frequency noise signals may be substantially reduced (or eliminated) in the display of successive image frames encoded in a wide bandwidth analog display signal.

In accordance with the present invention, a clock generator in a display unit first generates an intermediate clock signal synchronized with the synchronization signals in a received analog display signal. Due to the synchronization, the analog display signal may be generally sampled in the samples duration if the intermediate clock signal were to be used as a sampling clock.

However, the sampling clock used for sampling the analog display signal is generated in accordance with the present invention by modulating the intermediate clock by different phase delay amounts for successive image frames (or horizontal lines). Due to the different phase delays, samples are taken at different sampling points for successive image frames for the same pixel position. The amount of phase delay is maintained to be small enough such that the samples are again taken in the samples duration.

The effect of displaying the sampled values on many digital display units (e.g., flat panel monitors) is that the image for the pixel position is perceived as if the sampled values are passed through a low-pass filter. This is because of at least one of two reasons—(1) the display units generally respond slowly to changes in image intensity, and (2) the human eye generally perceives an average intensity when a display is varied in quick succession. It may be noted that the filtering action is temporal in nature, that is, the average of intensities across a few successive frames is perceived for each pixel position (point) on a digital display screen.

As a result of the low-pass filter action, each pixel position on a display screen is perceived to have been displayed with an average of the sampled data values for the pixel position. As the average is typically less than any samples which may consistently deviate substantially in successive image frames due to high frequency noise, display artifacts may be substantially reduced.

In addition, if noise is present minimally or is absent, all the sampled data element values may be substantially equal and no degradation in display quality is generally felt.

Thus, the present invention provides an effective method and apparatus to reduce display artifacts which may be caused distortions (from ideal stair-way signal) present in wide-band analog display signals. This is achieved by changing the phase delay of the sampling clock minimally for successive image frames.

The present invention is particularly suited for low-cost digital display units because only addition of integrated circuit is necessary to reduce the display artifacts. In addition, the present invention takes advantage of the low-pass filter naturally present with respect to human eye perception and flat-panel monitor displays to avoid the need for additional low pass filter also.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention provides a method and apparatus for generating a sampling clock signal for sampling an analog display signal received by a digital display unit. The sampling clock is generated such that display artifacts caused by high frequency noise signals may be substantially reduced (or eliminated) in the display of successive image frames encoded in a wide bandwidth analog display signal. The manner in which the display artifacts are reduced is explained below first with general reference to FIG. 8.

Figure 1A:
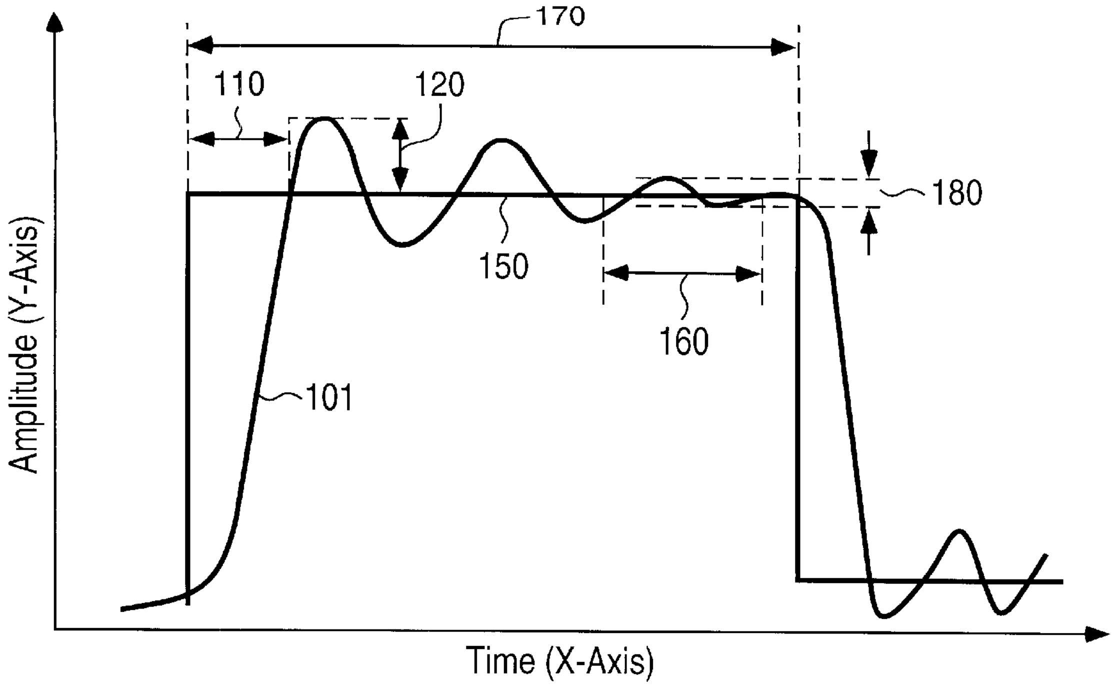
FIG. 1A (Prior Art)
FIG. 1A is a graph of a wide bandwidth analog signal illustrating the characteristics of a portion of the signal encoding an pixel data element value.
Figure 1B:
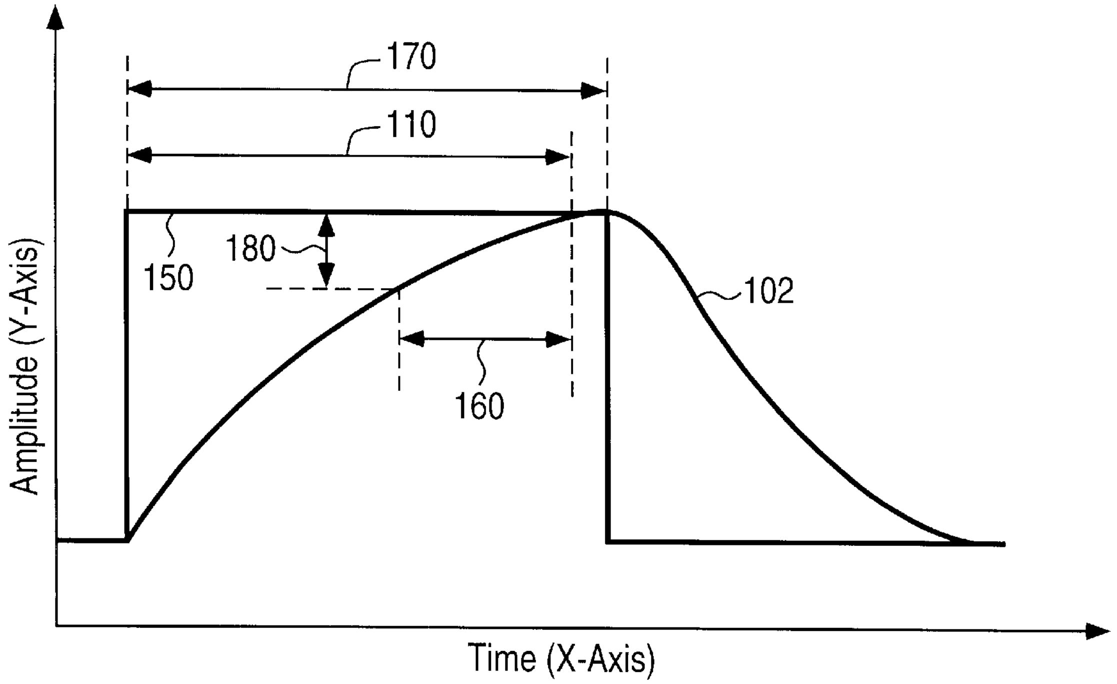
FIG. 1B (Prior Art)
FIG. 1B is a graph of a narrow bandwidth analog signal illustrating the characteristics of a portion of the signal encoding an pixel data element value.
Figure 8:
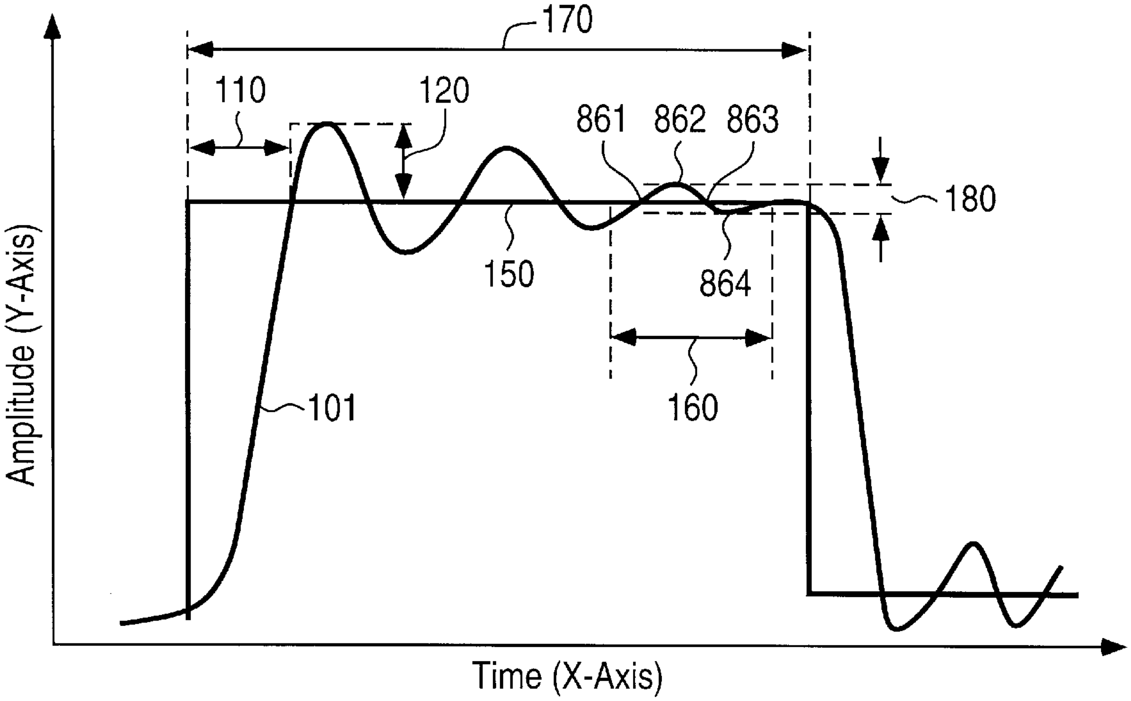
FIG. 8 is a graph of a wide bandwidth analog display signal illustrating the sampling points resulting from modulation using different phase delays.

In relation to FIG. 1A, FIG. 8 includes potential sampling points 861–864 in addition. The parts of FIG. 8 already included in FIG. 1A are not described here for conciseness. The sampling points are located in sampling duration 160.

With reference to FIG. 8, assume for illustration that signal 101 represents the display data portion for each of a few pixel data elements, with the few pixel data elements corresponding to a consecutive image frame and to the same pixel position in the image frames. For example, four pixel data elements may correspond to $100^{th}$ pixel data element in $200^{th}$ row in four consecutive image frames of 640×480 pixels size.

In accordance with the present invention, an intermediate clock signal synchronized with the synchronization signals (associated with the display data portion) is generated first. Synchronization has the general effect of ensuring that samples will be taken at a specific sampling point (assume at sampling point 862 for illustration) in samples duration 160. That is, if the intermediate clock were to be used as a sampling clock (and assuming no jitter in the sampling clock), the samples are likely to be taken at (or very close to) the specific sampling point (sampling point 862).

In accordance with the present invention, a sampling clock is generated by modulating the intermediate clock signal by different phase delay amounts ("phase delta" or "modulation index") in successive frames. The phase delta may be modified either in successive lines or frames. The phase delta is maintained to be small enough such that the samples are taken in the samples duration 160. Continuing with the above illustration, the phase delta may be varied such that samples are taken at sampling points 863, 861 and 864 for the following image frames for pixel position $100^{th}$ pixel data element in 200 row.

As may be appreciated, if the sampled pixel data elements are passed through a (temporal) low pass filter, any samples deviating substantially from an average value in the samples duration 160 may have less effect on the displayed image due to the sampling at different sampling points. Thus, an embodiment may be implemented with a low pass filter which ensures that substantial averages from the mean do not have a dominant effect on the display. The output of the low-pass filter may be used to generate display on a digital display screen.

However, such a low pass filter may not be used in an alternative embodiment for one of two reasons—(1) the human eye generally perceives only the average color intensities when quick changes in the color intensity are presented, and (2) displays screens of digital display units generally respond slowly to changes in color intensity. As the images are scanned at rates in the range of at least 50–100 Hz in typical display units, either of these phenomenon may operate as a natural low pass filter. Accordingly, the change in the phase delay across consecutive frames may result in the reduction of display artifacts which would other wise result from the high frequency noise components in wide bandwidth signals may be accomplished without using an extra low-pass filter.

The present invention is described below in further detail with reference to one or more example embodiments. It is useful to first describe an example environment in which the present invention can be implemented. Therefore, an example environment in which the present invention can be used is described below.

2. Example Environment

In a broad sense, the invention can be implemented in any computer system having a digital display unit such as a flat panel monitor. The present invention is described in the context of a computer system operating in graphics modes such as EGA, VGA and SVGA modes. Such computer systems include, without limitation, lap-top and desk-top personal computer systems, work-stations, special purpose computer systems, general purpose computer systems, network computers, and many others. The invention may be implemented in hardware, software, firmware, or combination of the like. The above noted graphics modes are described in detail in a book entitled, "Programmer's Guide to the EGA, VGA, and Super VGA Cards", published by Addition-Wesley Publishing Company, by Richard F. Ferraro, ISBN Number 0-201-62490-7, which is incorporated in its entirety herewith.

Figure 2:
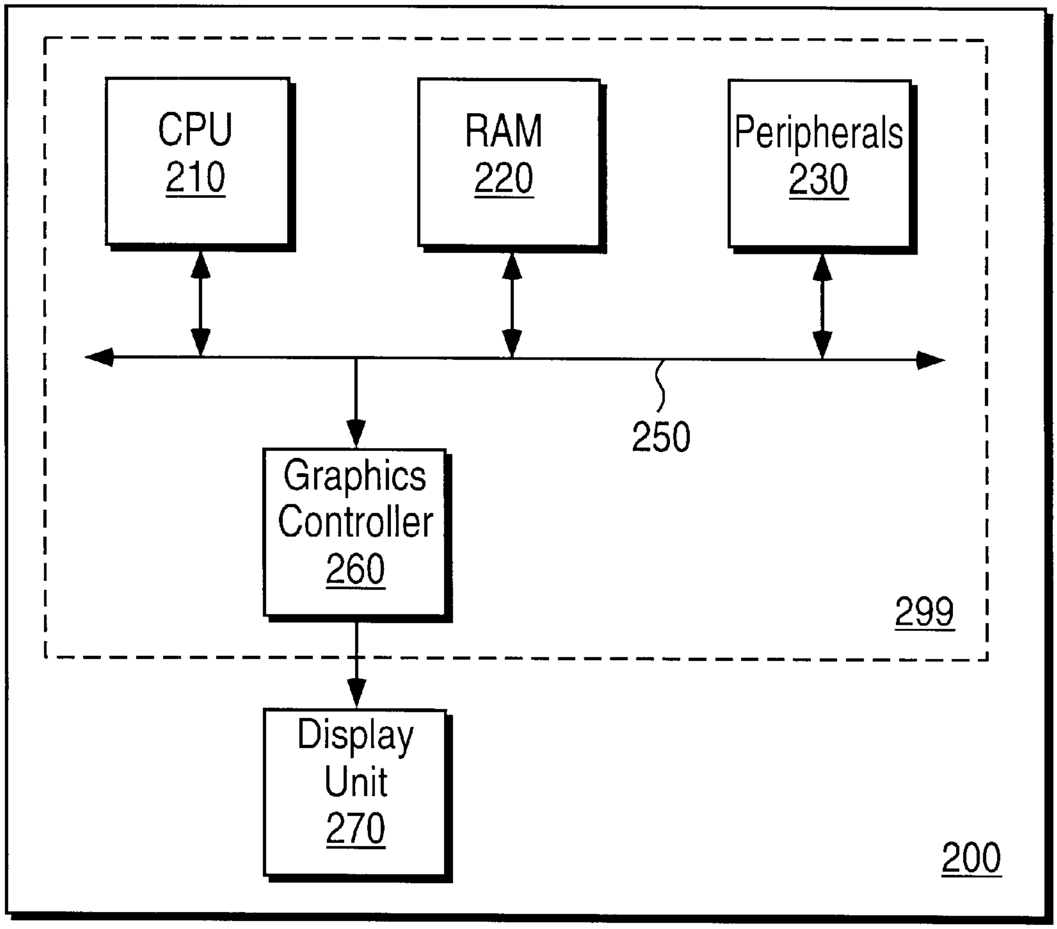
FIG. 2 is a block diagram of a computer system illustrating an example environment in which the present invention can be implemented.

FIG. 2 is a block diagram of computer system 200 in which the present invention can be implemented. Computer system 200 includes central processing unit (CPU) 210, random access memory (RAM) 220, one or more peripherals 230, graphics controller 260, and digital display unit 270. CPU 210, RAM 220 and graphics controller 260 are typically packaged in a single unit, and such a unit is referred to as graphics source 299 as an analog display signal is generated by the unit. All the components in graphics source 299 of computer system 200 communicate over bus 250, which can in reality include several physical buses connected by appropriate interfaces.

RAM 220 stores data representing commands and possibly pixel data representing a source image. CPU 210 executes commands stored in RAM 220, and causes different commands and pixel data to be transferred to graphics controller 260. Peripherals 230 can include storage components such as hard-drives or removable drives (e.g., floppy-drives). Peripherals 230 can be used to store commands and/or data which enable computer system 200 to operate in accordance with the present invention. By executing the stored commands, CPU 210 provides the electrical and control signals to coordinate and control the operation of various components.

Graphics controller 260 receives data/commands from CPU 210, generates analog display signals including display data and corresponding synchronization signals, and provides both to digital display unit 270. Graphics controller 260 can generate an analog display signal in the RS-170 standard with RGB signals in one embodiment. In that embodiment, the analog display signal is in the form of RGB signals and the reference signal includes the VSYNC and HSYNC signals well known in the relevant arts. Therefore, three analog display signals (red, green and blue) are generated from each pixel data element. For conciseness, the present invention is described with reference to one display data signal. It should be understood that the description may be applicable to all the three display data signals. It should be further understood that the present invention can be implemented with analog image data and/or reference signals in other standards even though the present description is provided with reference to RGB signals. Examples of such standards include composite sync standard usually implemented on Macintosh Computer Systems and Sync on Green standard.

In general, graphics controller 260 first generates pixel data elements of a source image with a predefined width and height (measured in terms of number of pixel data elements).

The pixel data elements for a source image may either be provided by CPU 210 or be generated by graphics controller 260 in response to commands from CPU 210. Graphics controller 260 typically includes a digital to analog converter (DAC) for generating an analog display signal based on the pixel data elements in a known way. The signals generated by DACs need to be of wide bandwidth signals particularly in view of the high image resolutions and scan rates.

Digital display unit 270 receives an analog display signal from graphics controller 260, and processes the received display signal. The received analog signal may include several components which cause the analog display signal to deviation from the ideal stairway signal. The components may include those that cause the overshoots (resulting from high speed DACs) and those introduced by reflections due to impedance mismatches in the path from DAC to display unit 270, among others as noted above in the section entitled "Background of the Invention." The display artifacts which may result from the noise components are minimized in accordance with the present invention as described below.

3. Method of the Present Invention

Figure 4:
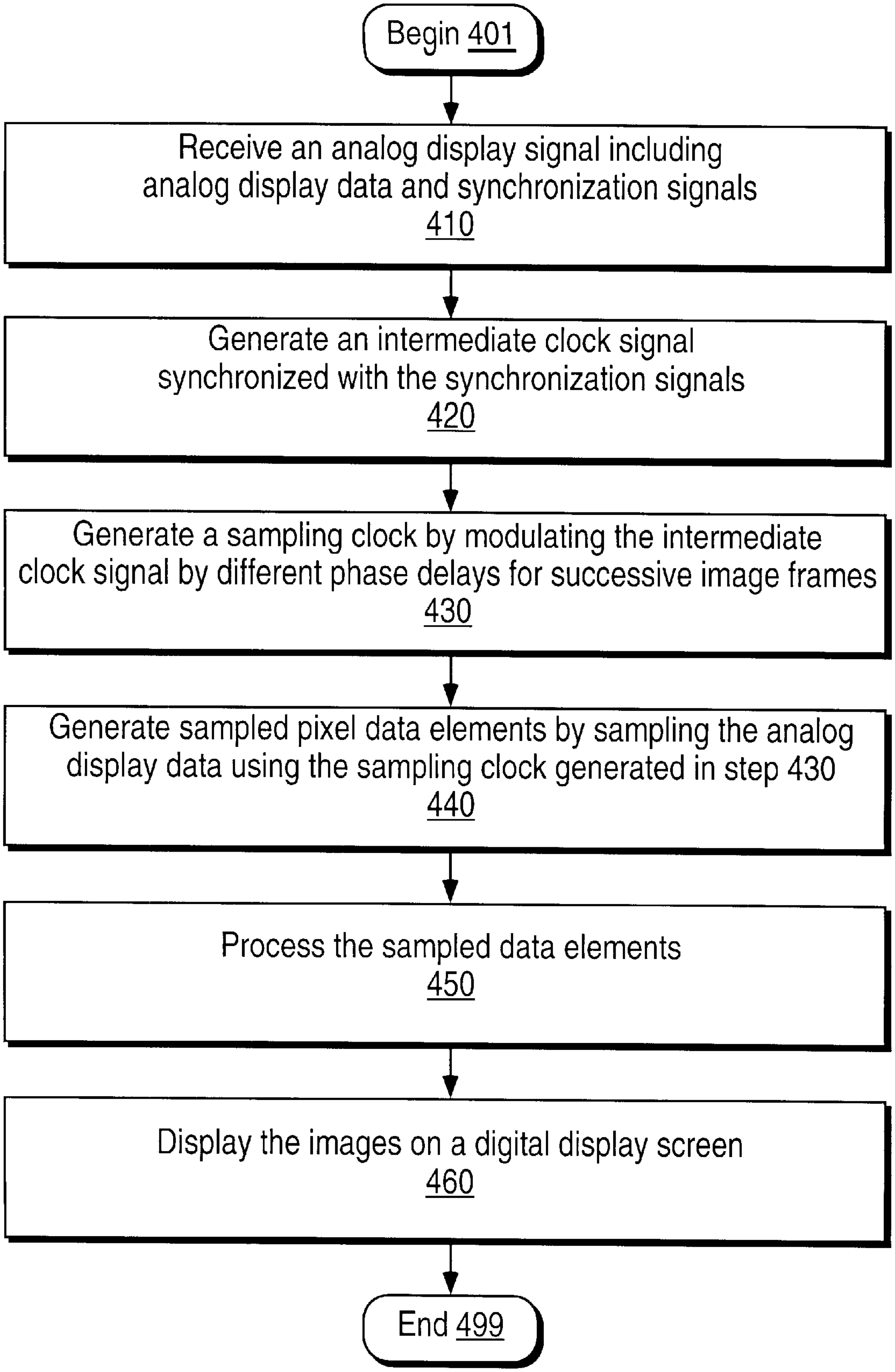
FIG. 4 is a flow-chart illustrating a method in accordance with the present invention.

FIG. 4 is a flow-chart illustrating a method in accordance with the present invention. For illustration, the method is described with reference to FIG. 2. In step 410, digital display unit 270 receives an analog display signal including analog display data and synchronization signals in a known way. In step 420, digital display unit 270 generates an intermediate clock signal synchronized with the synchronization signals. Due to such synchronization, a sampling scheme using the intermediate clock signal would sample an analog display signal in a samples duration 160. However, the actual sampling clock is generated by modulating the intermediate clock signal as described with reference to step 430.

In step 430, digital display unit 270 generates a sampling clock by modulating the intermediate clock signal by different amounts of phase delay for successive image frames in the display signal. The analog display data included in the received analog display signal is sampled using the sampling clock in step 440. The modulation of step 430 has the general effect that samples are taken at different points in the samples duration for the same pixel position in successive image frames. With reference to FIG. 8, 861–864 represent such different points in the samples duration.

Continuing with combined reference to FIGS. 2 and 4, in step 450, digital display unit 270 processes the sampled data elements. Processing may entail steps such as resizing. The pixel data elements generated by the processing of step 450 can be used for generating display signals on a digital display screen in step 460. Due to the change of phase delay by different amounts in step 430, display artifacts resulting from any noise components may be reduced.

Thus, display artifacts may be reduced in digital display units by using the method of FIG. 4. The method can be implemented in several embodiments as will be apparent to one skilled in the relevant arts by reading the description-.herein. An example embodiment is described below.

4. Digital Display Unit

Figure 3:
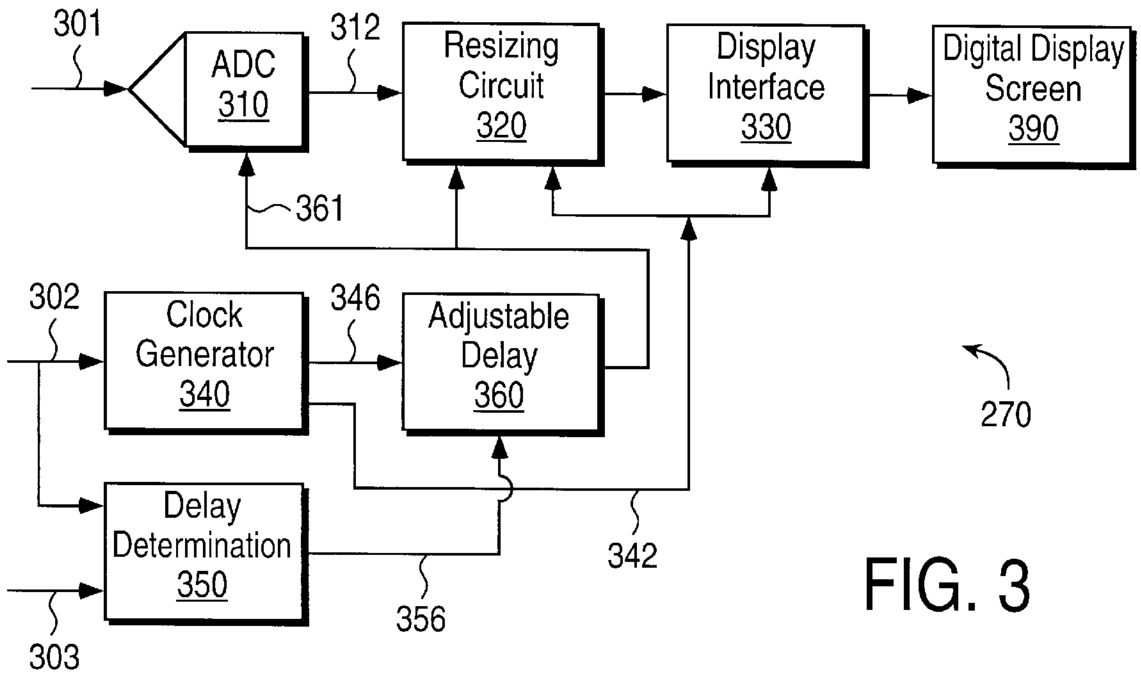
FIG. 3 is a block diagram of a digital display unit implemented in accordance with the present invention.

FIG. 3 is a block diagram of digital display unit 270 illustrating an embodiment in accordance with the present invention. Digital display unit 270 can include ADC 310, resizing circuit, display interface 330, clock generator 340, delay determination block 350, adjustable delay 360, and digital display screen 390. Each block is described in detail below.

ADC 310 samples analog display data received on line 301 using a sampling clock received on SCLK signal 361. ADC 310 may be implemented in a known way. Resizing circuit 320 receives the sampled data elements on line 312 from ADC 310, and upscales or downscales the image represented by the sampled data elements. Resizing circuit 320 may use clock signals from clock generator 340 for performing the resizing operation. Embodiments of upscaler are described in U.S. Pat. No. 5,739,867, entitled, "A Method and Apparatus for Upscaling an Image" issued on Apr. 4, 1998, and naming as inventor Alexander J. Eglit, which is incorporated in its entirety into the present application. The embodiments there may use SCLK signal 361 and DCLK signal 342.

Display interface 330 receives pixel data elements representing images to be displayed from resizing circuit 330, and generates displays signals compatible with digital display screen 390. Display interface 330 may used DCLK signal 342 to generate the display signals to cause digital display screen 390 to generate images. Clock generator 340 receives horizontal synchronization signals (HSYNC) on line 302, and generates DCLK signal 342 and an intermediate clock signal on line 346. A embodiment of clock generator 340 is described in the co-pending U.S. Patent Application entitled "A Method and Apparatus for Clock Recovery in a Digital Display Unit", Ser. No. 08/803,824, Filed Feb. 24, 1997, and is incorporated in its entirety into the present application herewith.

Digital display screen 390 includes several pixels organized as rows and columns. A pixel position refers to a pixel in a given row and column. Several digital display screens (particularly with flat panels) are designed such that pixels respond slowly to changes in display intensity. That is, if the color intensity is varied during successive scans at a pixel, the change in display intensity is slow at that pixel position in the display. The slow response makes the digital display screen 390 operate as a temporal low pass filter when displaying pixels scanned with varying intensities in successive image frames.

Adjustable delay 360 delays (or modifies in general) the intermediate clock signal by a phase delay amount which may be determined by an input received on line 356. Delay determination circuit 350 determines the phase delay amount. The amount of delay can be determined according to any scheme so long as the eventual sampling with the samples duration and the sampling point is generally different among consecutive frames. Delay determination circuit 350 and adjustable delay 360 together may be viewed as a modulation circuit, which modulates intermediate clock signal 346 by different phase delay amounts such that samples on successive frames corresponding to a given pixel position are taken at different sampling points in a samples duration.

Due to such variable phase delay, display artifacts caused by noise components may be minimized as described above in the section entitled, "Overview and Discussion of the Present Invention" with reference to FIG. 8. Several example embodiments for delaying the intermediate clock signals are described below. Several other embodiments will be apparent to one skilled in the relevant arts based on the description provided herein, and such other embodiments are contemplated to be within the scope and spirit of the present invention.

5. Adjustable Delay

Figure 5A:
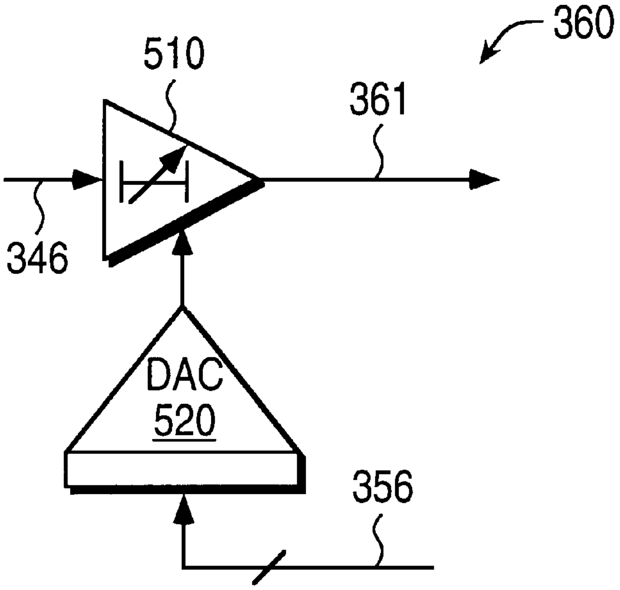
FIG. 5A is a block diagram illustrating an analog implementation of adjustable delay block.

Adjust able delay 360 can be implemented using analog components, digital components or the like. Example implementations are illustrated with reference to FIGS. 5A and 5B. FIG. 5A depicts analog variable delay 510 driven by digital to analog converter (DAC) 520. DAC 520 receives on line 356 an input number representing the phase delay by which an intermediate clock received on line 346 needs to be delayed. The output of DAC 520 is proportional to the received number, and the output voltage drives analog variable delay 510 to modulate (delay) the intermediate clock signal proportionate the input number on line 356. DAC 520 and variable delay 510 can be implemented using conventional components.

Figure 5B:
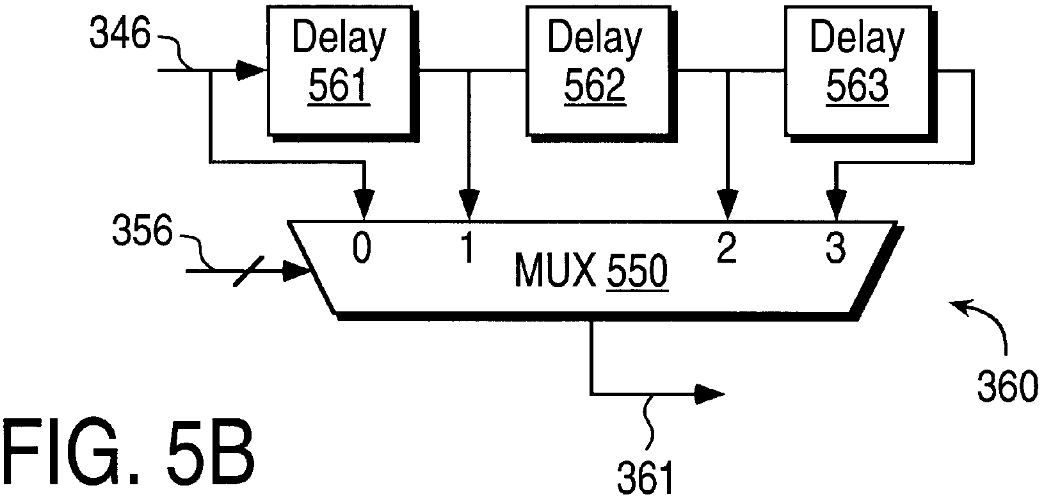
FIG. 5B is a block diagram illustrating another implementation of the adjustable delay block.

FIG. 5B illustrates an another embodiment of adjustable delay 360. Delay elements 561–562 delay an intermediate clock signal received on line 346 preferably by equal time durations. The delays are typically in the range of a fraction of a nano-second (for fast sampling clock signals) to a few nano-seconds such that even the longest delayed signal from delay 563 causes samples to be taken during the samples duration 160 (of FIG. 8). Even though only four delay elements are shown, several more delay elements may be implemented in adjustable delay 360.

Multiplexor 550 receives as inputs the outputs of all the delay elements 561–563 and the input clock signal received on line 346. Multiplexor 550 selects one of the inputs under the control of line 356. The number on line 356 generally indicates the input to be selected. The number can be generated in one of several ways. Some example embodiments for generating the number are described below with reference to FIGS. 7, 6A and 6B.

7. Delay Determination Circuit

Delay determination circuit 360 can be implemented in hardware, software, firmware, or combination of the like. An example method of generating the numbers substantially in software is described with reference to FIG. 6. Embodiments implemented substantially in hardware are illustrated with reference to FIGS. 7A and 7B.

Figure 6:
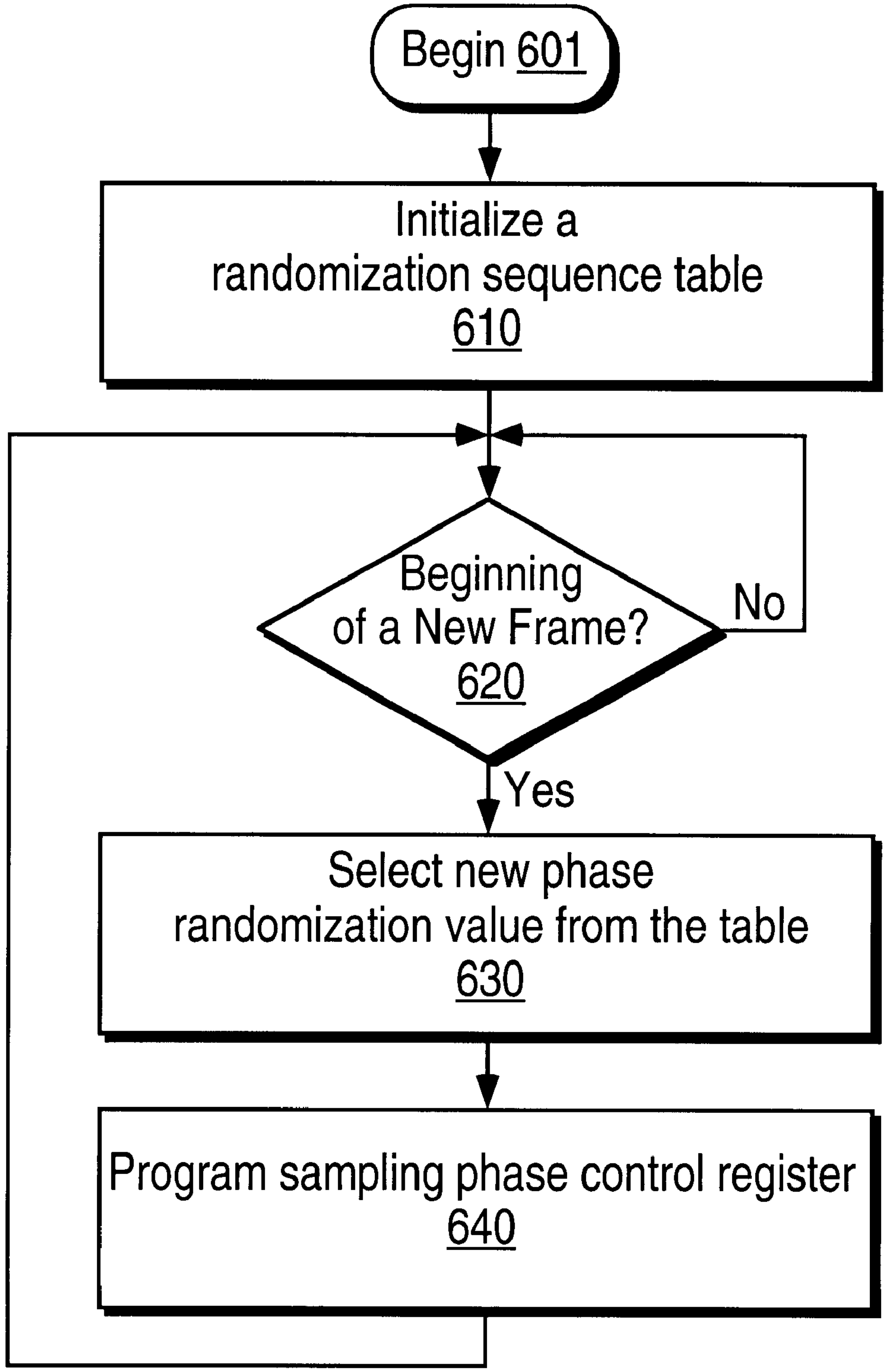
FIG. 6 is a flow-chart illustrating the manner in which different phase delays can be computed for successive image frames.

With reference to the flow-chart of FIG. 6, in step 610, a randomization table including a sequence of random numbers may be generated and stored in a memory (not shown) in display unit 270. Each random number can represent an absolute value representing delay as an input to DAC 520 in FIG. 5A, or an input to multiplexor 550 in FIG. 5B. The random numbers can be chosen arbitrarily or according to a pre-determined algorithm. In step 620, a determination is made as to whether a new image frame is being received (e.g., by examining VSYNC signals).

If a new frame is being received, a new randomization number is selected from the randomization table in step 630. In step 640, the selected value is stored in a phase delay control register (not shown) included within delay determination circuit 360. The phase delay control register drives adjustable delay 360. As a new number affecting the phase delay modification of the intermediate clock signals is selected for every frame, the sampling point may be different in successive frames.

Figure 7A:
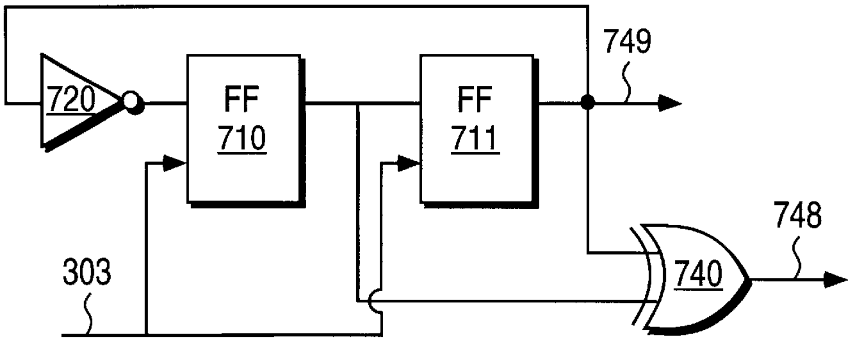
FIG. 7A is a block diagram illustrating a circuit for generating different phase delays for successive image frames.
Figure 7B:
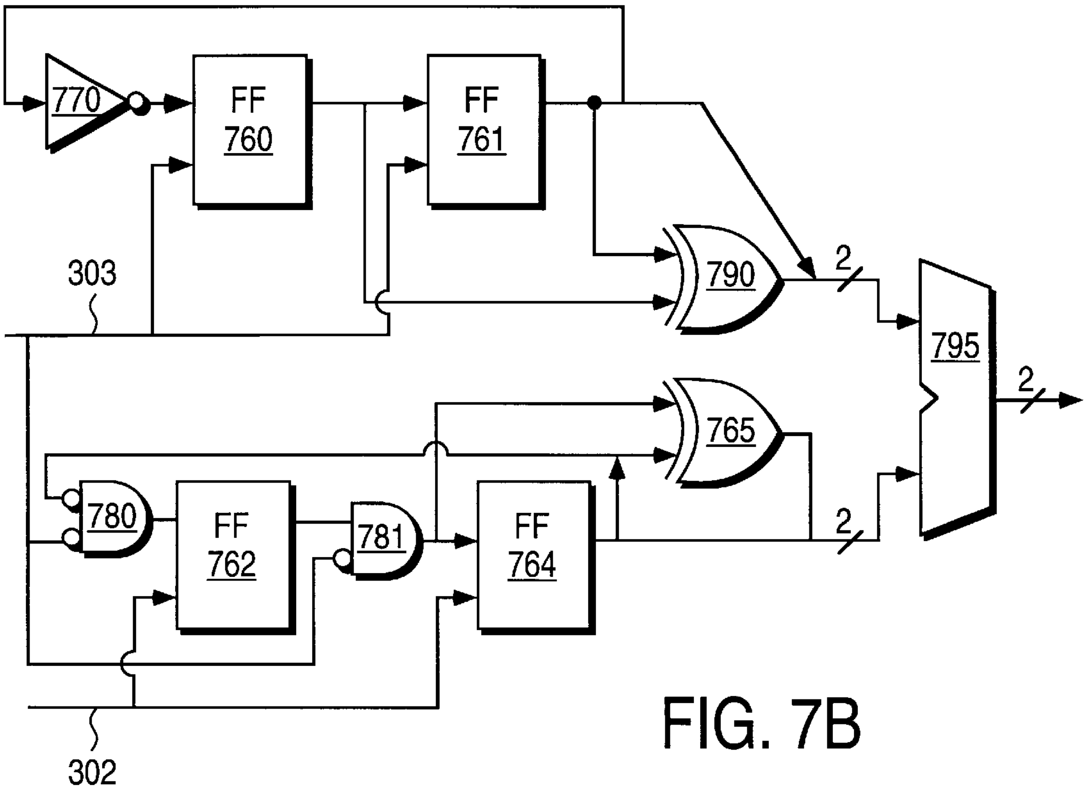
FIG. 7B is a block diagram illustrating another circuit for generating different phase delays which vary for each line.

FIGS. 7A and 7B illustrate embodiments of delay determination 350 implemented in hardware. Both Figures generally depict circuits for generating random numbers, which are known well in the relevant arts. The embodiment of FIG. 7A changes the phase modification value once every frame, which the embodiment of FIG. 7B changes the phase modification value once every line. In either case, the sampling point is generally different for successive frames for the same pixel position.

The simple Johnson counter depicted in FIG. 7A generates a randomization sequence of 0, 2, 1, 3, 0, 2, 1 on the two bits 749 (bit 0) and 748 (bit 1). Flip-flops (FFs) 710 and 711 are clocked by the VSYNC signal available on line 303. XOR gate 740 receives as inputs the outputs of flip-flops 710 and 711. Inverter 720 inverts the output of flip-flop 711 and provides the inverted value as input to flip-flop 710. The two bits together may be provided on bus 356 of FIG. 3.

FIG. 7B includes two portions 791 and 792, each providing a two bit output. The two bit outputs are added by adder 795. Portion 791 operates similar to the circuit in FIG. 7A and is not described again for conciseness. Portion 792 also operates similar to the circuit of FIG. 7A except that the inputs to flip-flops 762 and 764 are provided by AND gates 780 and 781 respectively. As both the AND gates have as one of the inputs the inverted VSYNC signal, flip-flops 762 and 764 are reset at the beginning of each frame. As flip-flops 762 and 764 are clocked by HSYNC signal 302, the output of portion 792 is computed each horizontal line. Thus, the embodiment of FIG. 7B provides a potentially different number every horizontal line. The number can be provide as an input to multiplexor 550 to select an intermediate signal delayed by an amount corresponding to the number.

Accordingly, it should be understood that the phase of the sampling clock signal provided to ADC 310 may be changed every line or every frame in accordance with the embodiments of above. As described above in further detail, due to the change of phase of the sampling clock, successive image frames encoded in an analog display signal may be sampled at different sampling points in the sampling duration. Due to the natural inclination of the human eye to perceive the average intensity of quickly changing points, and the digital display screen's general characteristic of responding slowly to changes in intensity of points while scanning, display artifacts which may otherwise result are reduced in accordance with the present invention.

8. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of displaying a plurality of image frames on a display screen of a digital display unit, wherein said plurality of image frames are encoded in an analog display signal, wherein said analog display signal includes an analog display data and corresponding synchronization signals, wherein each of a plurality of portions of said analog display data encodes a pixel data element value included in a plurality of pixel data element values, said plurality of pixel data element values defining a corresponding image frame, said method comprising the steps of:

(a) receiving said analog display signal in said digital display unit;

(b) generating an intermediate clock signal synchronized with said synchronization signals;

(c) sampling said analog display data using a sampling clock signal to generate a plurality of sampled data values;

(d) displaying images on said display screen based on said sampled data values generated in step (c);

(e) generating said sampling clock signal by modulating said intermediate clock signal by a different phase delay amount for successive image frames, wherein the modulation by a different phase delay amount in step (e) causes said analog display data to be sampled at different sampling points for the same pixel position in said successive image frames.

2. The method of claim 1, further comprising the step of providing said display screen which responds slowly to changes in intensity while being scanned, and wherein said slow response causes said digital display screen to operate as a low pass filter such that a user perceives the average intensity corresponding to different sampled data element values generated for the sampled pixel position in said successive image frames.

3. The method of claim 1, wherein a human eye perceives the average intensity of pixels on said digital display screen when the intensity of said pixels change rapidly, and wherein the averaging effect operates as a low pass filter such that a user perceives the average intensity corresponding to different sampled data element values generated for the sample pixel position in said successive image frames.

4. The method of claim 1, further comprising the step of passing said pixel data elements corresponding to the same pixel position through a low-pass filter such that a pixel intensity corresponding to the average value of said pixel data elements is displayed on said digital display screen.

5. The method of claim 1, wherein steps (b) and (e) comprise the steps of:

(f) maintaining a phase delay control register to specify said phase delay amount by which said intermediate clock is to be modified;

(g) generating a randomization sequence table including a plurality of randomization values;

(h) selecting one of said plurality of randomization values at the beginning of reception of each of said plurality of frames; and (i) storing said randomization value selected in step (h) into said phase delay control register such that said selected randomization value specifies said phase delay by which said intermediate clock is to be modified.

6. The method of claim 1, wherein step (e) comprises the step of phase delay said intermediate clock signal once for each horizontal line included in said plurality of image frames.

7. The method of claim 1, wherein step (e) comprises the step of phase delay said intermediate clock signal once for each of said plurality of image frames.

8. A circuit for generating a sampling clock signal for an analog to digital converter (ADC) in a digital display unit, wherein said sampling clock signal includes an analog display data and corresponding synchronization signals, wherein each of a plurality of portions of said analog display data encodes a pixel data element value included in a plurality of pixel data element values, said plurality of pixel data element values defining a corresponding image frame, said circuit comprising:

a clock generator circuit for generating an intermediate clock signal synchronized with said synchronization signals, wherein said intermediate clock signal is designed to cause said analog display data to be sampled in a sampling duration if said intermediate clock signal were to be used for sampling said analog display signal, wherein said analog display signal in said sampling duration represents at least substantially a corresponding pixel data element value encoded in a corresponding sampled portion;

a modulation circuit for modulating said intermediate clock signal by a different phase delay amount for successive image frames of said analog display signal, such that said analog display data is sampled at different sampling points in said sampling duration for the same pixel position in said successive image frames.

9. The circuit of claim 8, wherein said modulation circuit comprises:

a delay determination circuit for determining an amount of phase delay by which said intermediate clock is to be modulated; and an adjustable delay block for modulating said intermediate clock signal by said amount of phase delay.

10. The circuit of claim 9, wherein said delay determination block comprises a programmable register for storing a number indicative of said amount of phase delay, and wherein said delay determination block receives a new number from a memory in response to a beginning of new image frame being received in said analog display signal, said delay determination block storing said new number in said programmable register such that said amount of phase delay is varied for each of said successive frames.

11. The circuit of claim 9, wherein delay determination block generates a sequence of random numbers, wherein each of said random numbers is representative of said different phase delay.

12. The circuit of claim 11, wherein said delay determination block generates one of said sequence of numbers for every image frame.

13. The circuit of claim 11, wherein said delay determination block generates one of said sequence of numbers for every horizontal line of said plurality of image frames.

14. The circuit of claim 9, wherein said adjustable delay block comprises:

an analog variable delay element coupled to receive said intermediate clock signal and generate said sampling signal; and an ADC for driving said analog variable delay element, said ADC receiving a sequence of numbers representing said amounts of phase delay, said generating an analog signal having an voltage proportional to each of said sequence of numbers, wherein said analog signal causes to delay said intermediate signal by an amount proportionate to said voltage to generate said sampling signal.

15. The circuit of claim 9, wherein said adjustable delay block comprises:

a plurality of delay elements coupled in sequence, wherein a first one of said plurality of delay elements receives said intermediate signal and each of said plurality of delay elements generates an output comprising said intermediate signal delayed by a different time delay; and a multiplexor selecting one of said outputs of said plurality of delays elements under the control of said delay determination circuit to generate said sampling clock signal.

16. A digital display unit for displaying a plurality of image frames, wherein said plurality of image frames are encoded in an analog display signal, wherein said analog display signal includes an analog display data and corresponding synchronization signals, wherein each of a plurality of portions of said analog display data encodes a pixel data element value included in a plurality of pixel data element values, said plurality of pixel data element values defining a corresponding image frame, said digital display screen comprising:

receiving means for receiving said analog display signal;

generating means for generating an intermediate clock signal synchronized with said synchronization signals;

sampling means for sampling said analog display data using a sampling clock signal to generate a plurality of sampled data values;

displaying means for displaying images on a display screen based on said sampled data values generated by said generating means;

means for generating said sampling clock signal by phase delay said intermediate clock signal by a different phase delay for successive image frames, and wherein using a different phase delay by said means for generating causes said analog display data to be sampled at different sampling points for the same pixel position in said successive image frames.

17. The digital display unit of claim 16, wherein said digital display screen includes a plurality of pixels, wherein said digital display screen is designed to respond slowly to changes in color intensity on any of said plurality of pixels, wherein said slow response causes said digital display screen to operate as a low pass filter such that a user perceives the average intensity corresponding to different sampled data element values generated for the sampled pixel position in said successive image frames.

18. A computer system, comprising:

a central processing unit (CPU) coupled to a bus;

a random access memory coupled to said bus;

a graphics controller circuit receiving a plurality of pixel data element values from said CPU, said graphics controller circuit generating an analog display signal including an analog display data and corresponding synchronization signals, wherein each of a plurality of portions of said analog display data encodes a pixel data element value included in said plurality of pixel data element values, said plurality of pixel data element values defining a corresponding image frame, wherein a plurality of image frames are encoded in said analog display signal;

a digital display unit coupled to said graphics controller circuit, said digital display unit for displaying said plurality of image frames, said digital display unit comprising:

a digital display screen;

a clock generator circuit for generating an intermediate clock signal synchronized with said synchronization signals;

a modulation circuit for generating a sampling clock signal by modulating said intermediate clock signal by different phase delay amounts for successive image frames, an analog to digital converter (ADC) coupled to said modulation circuit, said ADC receiving said sampling clock and sampling said analog display data to generate a plurality of pixel data elements, wherein modulation by different phase delay amounts causes said ADC to sample said analog display data at different sampling points for the same pixel position in said successive image frames; and an interface for generating display signals on said digital display screen based on said plurality of pixel data elements.

19. The computer system of claim 18, wherein said digital display screen includes a plurality of pixels, wherein said digital display screen is designed to respond slowly to changes in color intensity on any of said plurality of pixels, wherein said slow response causes said digital display screen to operate as a low pass filter such that a user perceives the average intensity corresponding to different sampled data element values generated for the sampled pixel position in said successive image frames.

* * * * *